(12) United States Patent
Huber et al.

(10) Patent No.: US 8,922,864 B2
(45) Date of Patent: Dec. 30, 2014

(54) MEMS DEVICE HAVING REDUCED DEFORMATIONS

(75) Inventors: Avigdor Huber, Yehud (IL); Moshe Medina, Haifa (IL)

(73) Assignee: STMicroelectronics International N.V., Amsterdam (NL)

( * ) Notice: Subject to any disclaimer, the term of this patent is extended or adjusted under 35 U.S.C. 154(b) by 1161 days.

(21) Appl. No.: 12/530,095

(22) PCT Filed: Feb. 28, 2008

(86) PCT No.: PCT/IL2008/000258
§ 371 (c)(1),
(2), (4) Date: Aug. 23, 2010

(87) PCT Pub. No.: WO2008/107870
PCT Pub. Date: Sep. 12, 2008

(65) Prior Publication Data
US 2010/0302609 A1    Dec. 2, 2010

Related U.S. Application Data

(60) Provisional application No. 60/904,910, filed on Mar. 6, 2007.

(51) Int. Cl.
G02B 26/08 (2006.01)
G02B 26/10 (2006.01)
G02B 26/12 (2006.01)
B81C 1/00 (2006.01)

(52) U.S. Cl.
CPC ........ G02B 26/0841 (2013.01); B81C 1/00142 (2013.01); B81B 2201/042 (2013.01); Y10S 359/904 (2013.01)
USPC ...................... 359/226.1; 359/226.2; 359/904

(58) Field of Classification Search
USPC .......... 359/198.1–199.4, 200.6–200.8, 202.1, 359/221.2, 223.1–225.1, 226.2, 290–295, 359/838, 846, 871, 827, 904; 250/204, 250/559.06, 559.29, 230, 234; 347/255–260; 353/39, 98–99; 385/15–18, 22; 398/12, 19, 45
See application file for complete search history.

(56) References Cited

U.S. PATENT DOCUMENTS

| | | | |
|---|---|---|---|
| 6,369,931 B1 | 4/2002 | Funk et al. | |
| 6,801,681 B2 | 10/2004 | Feierabend et al. | |
| 6,817,725 B2 | 11/2004 | Mizuno et al. | |
| 7,042,613 B2 | 5/2006 | Barnea et al. | |
| 7,177,063 B2 | 2/2007 | Krylov et al. | |
| 2003/0039021 A1 | 2/2003 | Ton | |
| 2004/0141894 A1 | 7/2004 | Mizuno et al. | |
| 2004/0228015 A1* | 11/2004 | Tsuboi et al. | 359/849 |
| 2005/0157363 A1* | 7/2005 | Orcutt | 359/224 |
| 2005/0200986 A1* | 9/2005 | Tsuboi et al. | 359/871 |

FOREIGN PATENT DOCUMENTS

WO    2006131916 A1    12/2006

\* cited by examiner

*Primary Examiner* — Stephone B Allen
*Assistant Examiner* — Kimberly N Kakalec
(74) *Attorney, Agent, or Firm* — Gardere Wynne Sewell LLP

(57) ABSTRACT

A MEMS apparatus is provided for scanning an optical beam. The MEMS apparatus is formed out of a pre-fabricated multi-layer device and comprises at least one tilting micro-mirror formed in a first active layer of that pre-fabricated multi-layer device and a support structure formed in a second layer of the pre-fabricated multi-layer device, and wherein the support structure is preferably formed by etching parts of the second layer to obtain a pre-determined shape of the supporting structure.

14 Claims, 6 Drawing Sheets

MEMS DEVICE HAVING REDUCED DEFORMATIONS

FIELD OF THE INVENTION

The present invention relates generally to micromachined structures and their fabrication and more particularly to rigid microelectromechanical systems ("MEMS") structures having reduced deformations.

BACKGROUND OF THE INVENTION

Multimedia devices become increasingly more popular. As the technology advances, the devices shrink and consequently so do their respective displays. Nowadays people watch television broadcast in their cell phone having an average of less than 10 cm$^2$ screens. Thus, the need for a light, removable, reliable and high resolution projector has never been bigger. One type of the devices that is being developed in the recent year is the personal projectors in which fast micro mirrors are used in controlling the path of a laser beam thereby providing the required images.

One of the difficulties in the design and fabrication of the fast mirrors is the requirement to deliver both large tilting angles and larger resonance frequencies which may be improved by reducing the mass of the mirror. However, reducing the mirror's mass can only be done by thinning the mirror (assuming that both the material of which it is made and the beam diameter are kept constant), leads to a new problem—development of dynamic deformations.

When the mirror vibrates, it experiences deformations resulting from its undeformed flat surface due to its inertial force and torque from the torsion bars referred to hereinafter as dynamic deformation, which disrupt the optical beam wavefront and damage the achievable resolution.

Some solutions have been suggested in the past, among which is the common solution of adding support structures to the mirror. These support structures add mass to the mirror and by careful design, they increase the mirror's rigidness thereby reducing the dynamic deformation, without adding too much to its mass.

US 2003039021 discloses a MEMS mirror and method for fabricating the mirror. The mirror has a plurality of structures that operatively rotate around a support structure. The mirror is fabricated, such that the silicon components are separated from a glass structure having electrodes to prevent shorting of the electrodes to the mirror.

US 2004190110 describes a MEMS device having a deformable segmented mirror. The mirror includes a plurality of movable segments supported on a substrate using spring vertices, each vertex having a fixed plate and one or more springs. Due to the fixed plates, motion of each movable segment is substantially decoupled from that of the adjacent segments, which makes the shape of the segmented mirror relatively easy to control.

US 2004245888 discloses a MEMS device having a deformable mirror and includes a deformable membrane supporting a plurality of light-reflecting segments that form the deformable mirror. The actuator(s) which is configured to apply torque to the side of the membrane, is used to deform the membrane. Membrane deformation causes the segments to change orientation and thereby change the shape of the mirror, reduce it deformation and improve the resolution.

US 2007019280 describes MEMS devices that comprise a conductive movable layer spaced apart from a conductive fixed layer by a gap, and supported by rigid support structures, or rivets, overlying depressions in the conductive movable layer, or by posts underlying depressions in the conductive movable layer. It also describes cases where portions of the rivet structures extend through the movable layer and contact underlying layers.

In "Electrostatic 1D Micro Scanner with Vertical Combs for HD Resolution Display" by Jin-Woo Cho et al. Proc. Of SPIE vol. 6466, pp. 64660B-1 to 64660B-12, an electrostatic one dimensional scanning mirror is described in which a vertical comb drive was used to tilt the micro mirror, and a rib was used to minimize the moment of inertia and maximize the tilting angle of the mirror. The rib described was patterned on the upper silicon layer before making the SOI wafer.

SUMMARY OF THE INVENTION

It is the object of the present invention to provide a method of fabricating supporting elements to thin layers MEMS structures using SOI or DSoI based technology.

It is another object of the present invention to provide a low mass MEMS scanning micro-mirror device which has low deformations.

It is yet another object of the present invention to provide a method for using DSoI wafers as the basis for fabricating MEMS structures out of a very thin layer of silicon and ruggedizing the thin structure with support structures patterned from the second silicon layer, thereby providing structures that are lightweight and rigid, enabling superior dynamic performance in fast moving applications such as scanning mirrors.

It is another object of the present invention to provide a method for combining a simple fabrication process with robustness of SOI or DSoI based devices, whereby obtaining devices that can be efficiently used for static and resonant operation of titling micro devices including micro mirrors, optical switches and attenuators and micro manipulators.

Other objects of the invention will become apparent as the description of the invention proceeds.

According to a first embodiment of the present invention there is provided a MEMS apparatus for scanning an optical beam formed from a pre-fabricated multi-layer device (such silicon-on-insulator ("SoI") substrate or a double active layer silicon-on-insulator ("DSoI") substrate) and comprising at least one tilting micro-mirror formed in a first active layer of the pre-fabricated multi-layer device and a support structure formed in a second layer of the pre-fabricated multi-layer device.

In accordance with another preferred embodiment of the invention, the pre-fabricated multi-layer device is a DSoI device, and the MEMS apparatus comprises at least one tilting micro-mirror formed in a first active layer of the DSoI device and a support structure formed in a second active layer of the DSoI device, and wherein an insulator, such as an oxide layer, separates between both these active layers.

In the alternative, the pre-fabricated multi-layer device is a SoI device, and the MEMS apparatus comprises at least one tilting micro-mirror formed in the active layer of the SoI device being the first active layer of the pre-fabricated multi-layer device and a support structure formed out of the substrate layer of the SoI device, and wherein an insulator, such as an oxide layer, separates between both these layers.

The technology of silicon on insulator (SOI) refers to the use of a layered silicon-insulator-silicon substrate in place of conventional silicon substrates in semiconductor manufacturing, especially microelectronics. SoI-based devices differ from conventional silicon-built devices in that the silicon junction is above an electrical insulator, typically silicon dioxide. The terms "active layer", "silicon layer" or "Si layer"

as used herein and throughout the specification and claims, should be understood as interchangeable with each other.

In accordance with a preferred embodiment of the invention, the support structure is formed by etching the full thickness of the second layer at pre-defined locations of that layer. In other words, by etching the full thickness of the second layer at certain sections, a pre-defined shape of the supporting structure of the MEMS apparatus is formed.

Preferably, the support structure is formed in a shape of a cross surrounded by a ring.

In accordance with another embodiment of the invention there is provided a method for fabricating at least one supporting element in a MEMS apparatus for scanning an optical beam formed from a pre-fabricated multi-layer device, the method comprising:

a. providing a wafer having a front side and a back side which comprises a at least one active layer and a second layer;
b. etching parts of the second layer to obtain a pre-determined shape of a supporting structure.

Step b. of the method described above is preferably carried out by etching parts of the second layer surface, where the etching is carried out through the full thickness of that second layer, e.g. until the layer separating the two active layers is reached.

By still another preferred embodiment of the invention, the wafer comprises a first Si layer, a second Si layer and an oxide layer interposed therebetween, and wherein said etching step is carried out in said second Si layer.

By yet another preferred embodiment of the invention the method provided further comprising a step of forming a reflecting mirror at the front side of the first of said at least one active layer.

In accordance with still another embodiment of the invention, the supporting structure is formed in a shape of a cross surrounded by a substantially circular shape.

According to yet another preferred embodiment of the invention, the method provided further comprises a step of selecting the initial thickness of the oxide layer so as to ensure that the support structure is made in a stop etch process of the required parts of the of second Si layer.

BRIEF DESCRIPTION OF THE DRAWINGS

For a more complete understanding of the present invention, reference is made to the following detailed description taken in conjunction with the accompanying drawings wherein.

DETAILED DESCRIPTION OF PREFERRED EMBODIMENTS

The present invention will be understood and appreciated more fully from the following detailed examples taken in conjunction with the drawings.

The micro mirrors of the device constructed in accordance with the present invention, deflect the laser beam in both X and Y axis at a speed that is directly linked to the image resolution supported by the projector. The X axis deflector mirror normally operates in resonance mode at frequencies ranging from about 10 KHz to about 40 KHz, depending on the projector resolution. Typically, there is an inherent conflict in the design of micro mirrors, in order to support higher resolution one would need a combination of a larger mirror and a larger tilting angle while maintaining good surface quality of the micro-mirror. Any required resolution can be translated into a requirement of ΘD, i.e. the product of Θ (the micro-mirror tilt angle) and D (the micro-mirror's diameter). Higher resolutions imply higher ΘD number as well as higher scanning frequency in the X direction.

However, the tilting angle is inversely proportional to the mass and geometry of the mirror and inversely proportional to the square of the resonance frequency. This may be demonstrated by the following equation:

$$\Theta_{tilt} = Q \cdot \frac{F}{(2\pi f_n)^2 \cdot J}$$

Where: F is the force generated by the mirror actuator;
$f_n$ is the resonance frequency;
Q is the system's quality factor; and
J is the mirror's moment of inertia (J is a function of the mass of the moving element and the geometry chosen).

One of the difficulties in the design and fabrication of fast moving mirrors is the need to deliver both large tilting angles and larger resonance frequencies. This need leads to a requirement to reduce J in order to compensate for the increase in $f_n$ which, in turn, leads to a requirement to reduce the mass of the mirror. However, reducing the mass of the mirror can only be done by reducing the mirror thickness since its area should remain fixed due to optical requirements. As previously explained, this reduction in mirror thickness might immediately lead to dynamic deformation.

This problem may be solved by adding support structure to the mirror which in turn adds mass to the mirror. Several methods were proposed in the past on how to add such a support. One such method is incorporating wafer bonding after separate patterning and partial etching of two wafers. However, the prior art methods result in fabrication inaccuracies which impose a limit upon the minimal mirror mass and other system performance parameters.

Figure 1:
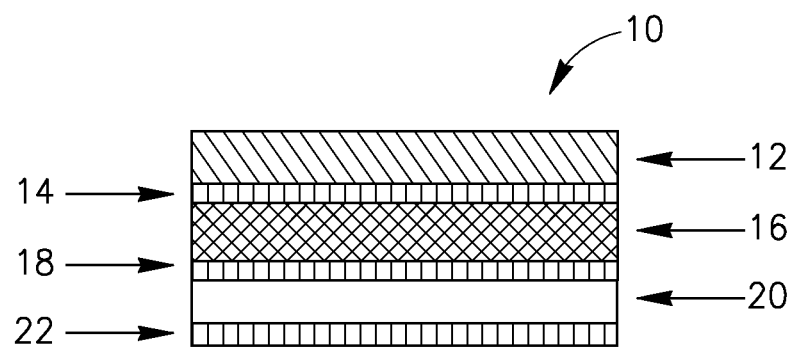
FIG. 1 presents a schematic view of a pre-fabricated DSOI wafer.

Let us now consider FIG. 1 which presents a schematic example of a prefabricated commercially available double-active-layer SOI (Double Silicon on Insulator, "DSOI") wafer 10, prior to its processing. The DSOI wafer typically comprises either a substrate and two active layers or a substrate and one active layer by using the substrate itself as one of the two active layers, where the active layer(s) and the substrate are bonded together before the starting of the fabrication process. The DSOI presented in this Fig. has a first active layer 12, an oxide layer 14, a second active layer 16, an oxide layer 18, a silicon substrate 20, and another oxide layer 22. The three semiconductor layers, first active layer 12, second active layer 16, and substrate 20 are electrically isolated from one another by the oxide layers. Oxide layer 14 is located between the first and second active layers, and oxide layer 18 is located between the second active layer and the substrate. Each active layer may have a thickness of a few to a few tens of microns.

Figure 2A:
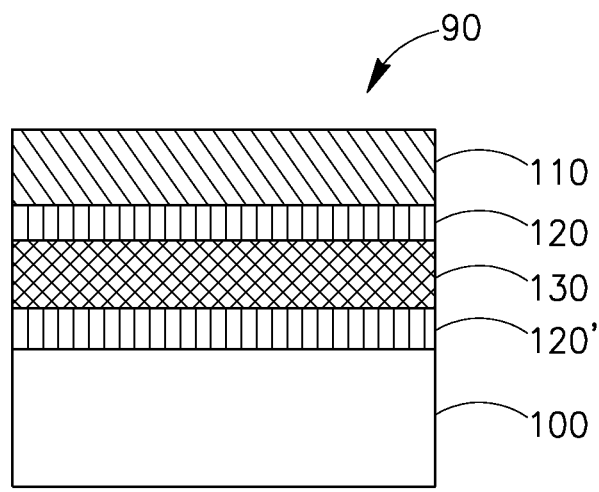
FIGS. 2A-2O illustrate a schematic process of preparing the MEMS device with the supporting structure of the present invention.
Figure 2B:
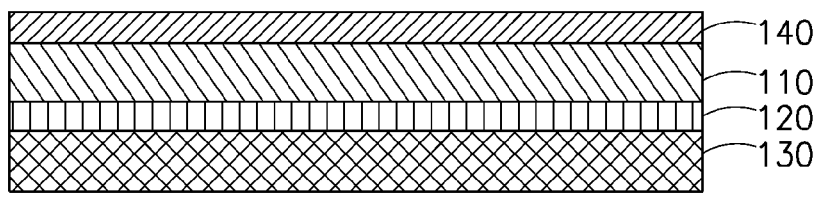
Figure 2C:
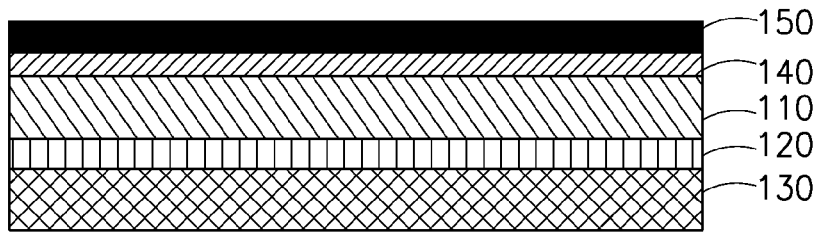
Figure 2D:
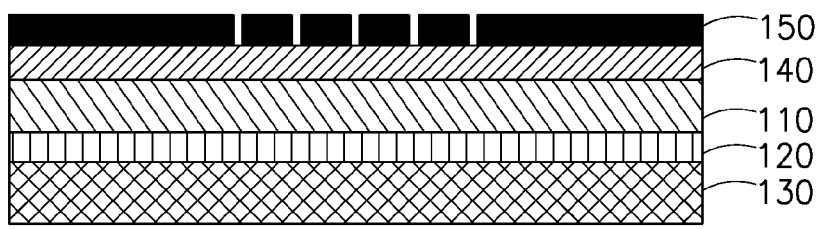
Figure 2E:
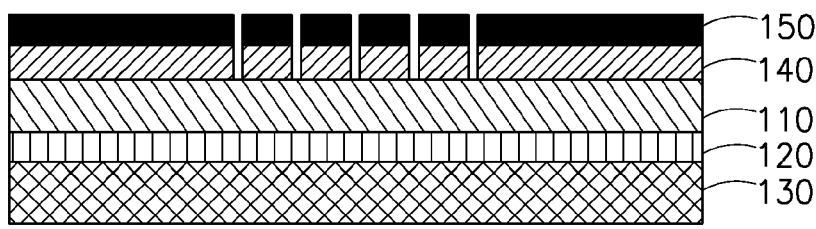
Figure 2F:
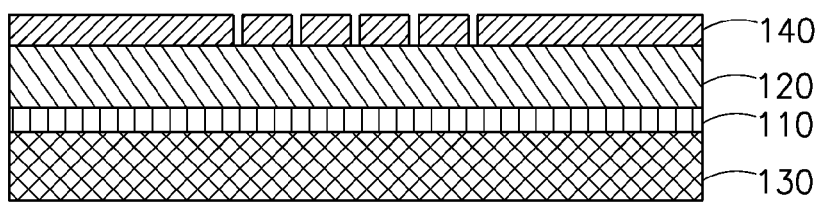
Figure 2G:
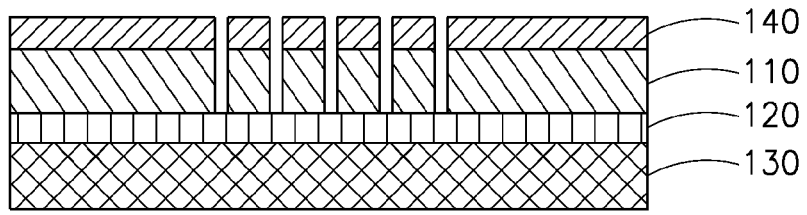
Figure 2H:
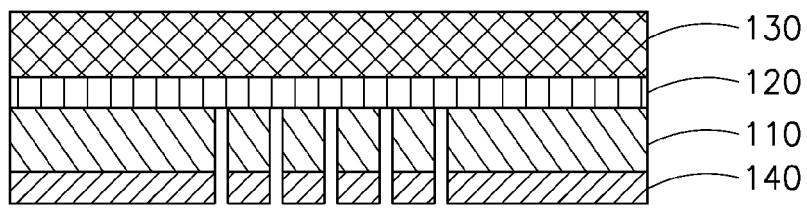
Figure 2I:
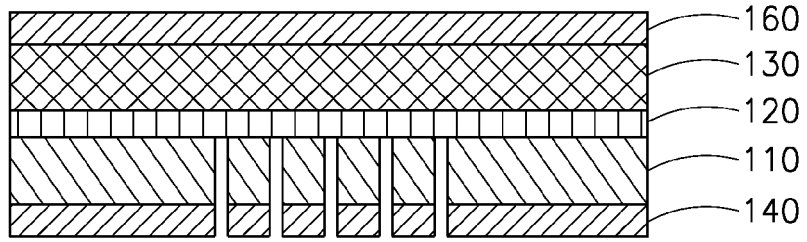
Figure 2J:
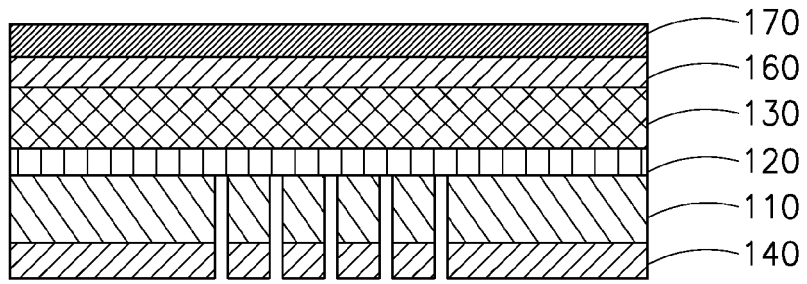
Figure 2K:
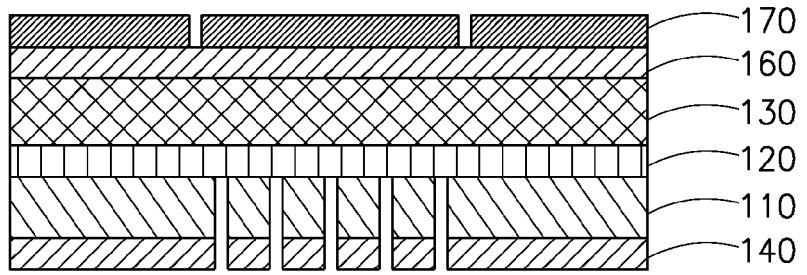
Figure 2L:
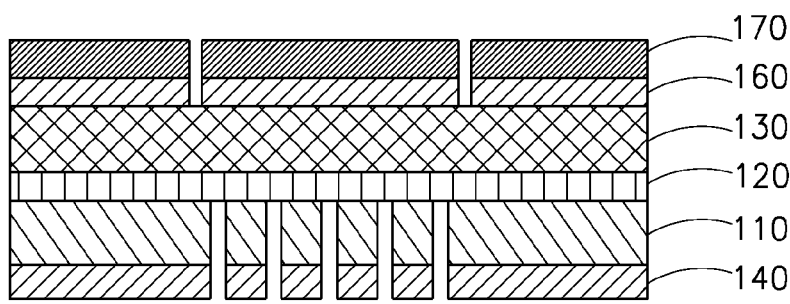
Figure 2M:
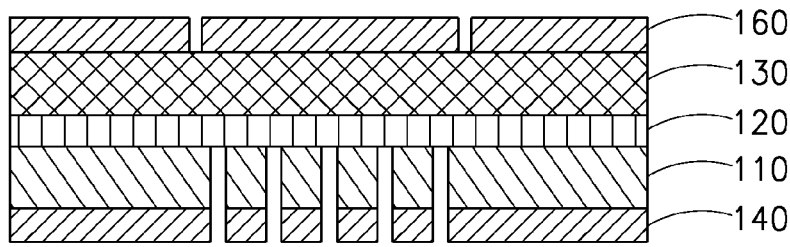
Figure 2N:
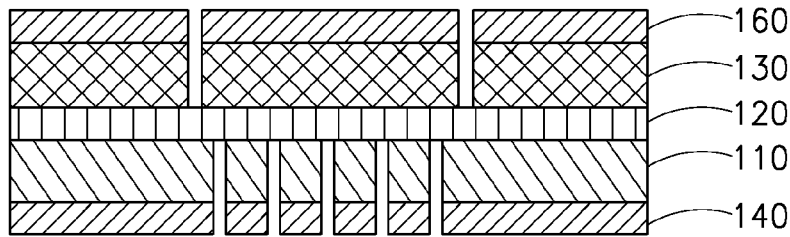
Figure 2O:
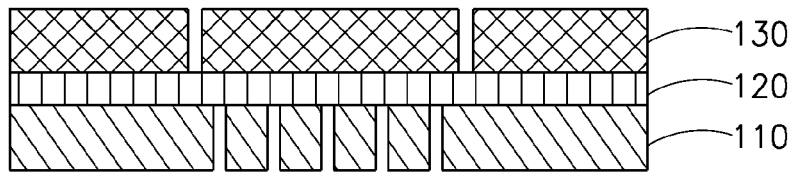

Details of a process used for fabricating a supported structure for bouncing mode electrostatic tilting micro-mirror are demonstrated in FIGS. 2A-2O. All dimensions of the respective layers and of resulting product of the process should be understood as being illustrative for demonstration purposes only. First, a typical wafer 90 is shown in FIG. 2A which comprises 2 active layers 110 and 130, a substrate layer (handle) 100 and two oxide layers 120 and 120'. Oxide layer 120 separates the first active layer 110 from the second active layer 130 and the second oxide layer 120' separates the second active layer 130 from substrate 100. In the following description of the process steps, only the two active layers 110 and 130, and the oxide layer interposed between them 120 will be referred to out of the wafer original layers.

The first step in the process is shown in FIG. 2B. In this step a Plasma Enhanced Chemical Vapor Deposition ("PECVD") layer 140 is prepared. In the next step, shown in FIG. 2C a photoresist layer 150 is deposited over the PECVD layer 140, and patterned (FIG. 2D), thereby providing a support mask. The PECVD layer 140 is then etched (FIG. 2E), forming the same pattern of the mask in the PECVD layer. Next, the photoresist is stripped off (FIG. 2F), followed by etching the required support structure of the present invention in active layer 110 (FIG. 2G). The wafer is then flipped over (FIG. 2H) so that the second active layer, 130, becomes now the upper layer. A new PECVD layer 160 is deposited on top of active layer 130 (FIG. 2I) and a new photoresist layer 170 is then deposited over PECVD layer 160 (FIG. 2J). The photoresist layer is patterned (FIG. 2K), thereby providing a mask suitable for the preparation of the required mirror and actuator. Next, The PECVD layer 160 is etched (FIG. 2L) in accordance with the pattern formed in photoresist layer 170 so that it may later serve as hard mask for etching active layer 130. The next step is shown in FIG. 2M, where the photoresist is stripped off, and then active layer 130 is etched in accordance with the etched PECVD layer 160 to obtain the required mirror and actuator for the device exemplified herein. This fabrication process ends in the step shown in FIG. 2N, where the two PECVD layers 140 and 160 are stripped off, ending with a device that comprises the mirror and the actuator in one active layer (130) and with the appropriate support structure in active layer 110. As may be seen from the above described process, the etching through both active layers in order to form both the support structure in layer 110 and the mirror and actuator in layer 130 is carried all the way through the respective layers, until reaching oxide layer 120 which is interposed therebetween. Thus, a very accurate etching is achieved as the solution according to the present invention does not rely on a stop etch method.

Figure 3:
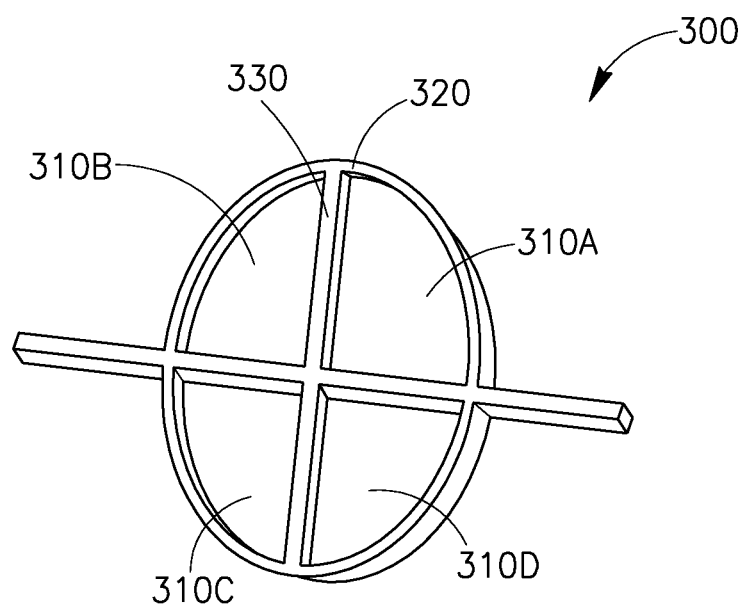
FIG. 3 presents a view of an exemplified supporting structure in accordance with an embodiment of the present invention.

FIG. 3 exemplifies an embodiment of a supporting element of the present invention, prepared of a DSOI prefabricated wafer, e.g. during a process as demonstrated in the example of FIGS. 2A-2O. The supporting element 300 has been etched from the back of the wafer using relatively large tolerances masks. The supporting element, in this example, designed as a cross (330) surrounded by a substantially circular shape such as a circular ring or an ellipsoid ring (320), made of the second active layer as described in the process exemplified in FIGS. 2A-2O. Cavities 310A, 310B, 310C and 310D are etched in a DRIE process with due care to ensure fabricating the cross pillars thick enough to prevent deformation of the mirror during deflection, and wide enough not to be etched away during the release process.

Figure 4:
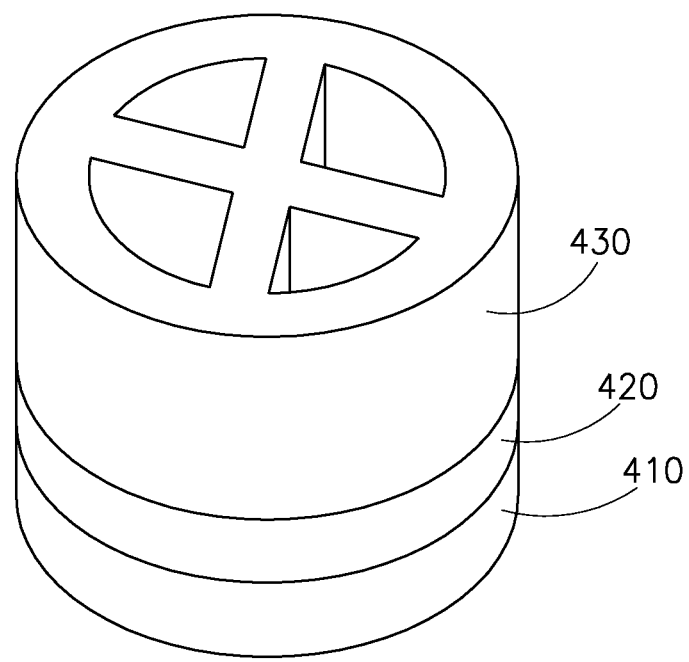
FIG. 4 shows a schematic isometric view of a device comprising the supporting structure of FIG. 3.
Figure 5A:
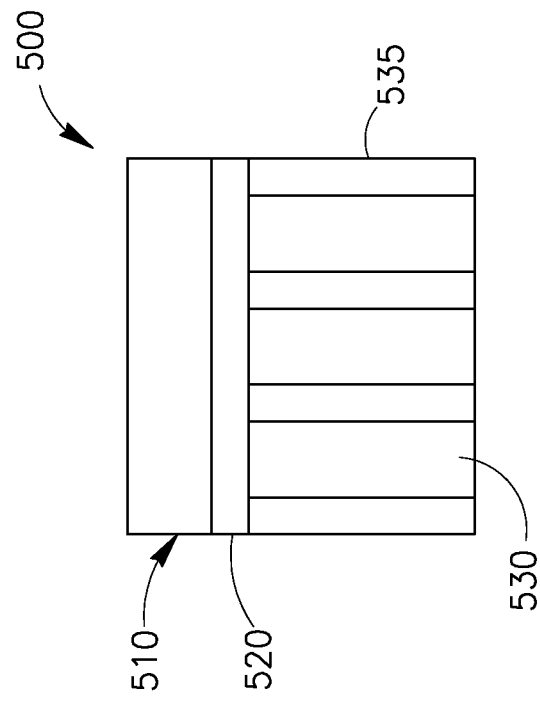
FIGS. 5A and 5B illustrate differences between the device of the present invention (FIG. 5A) and a device fabricated in accordance with prior art methods (FIG. 5B).
Figure 5B:
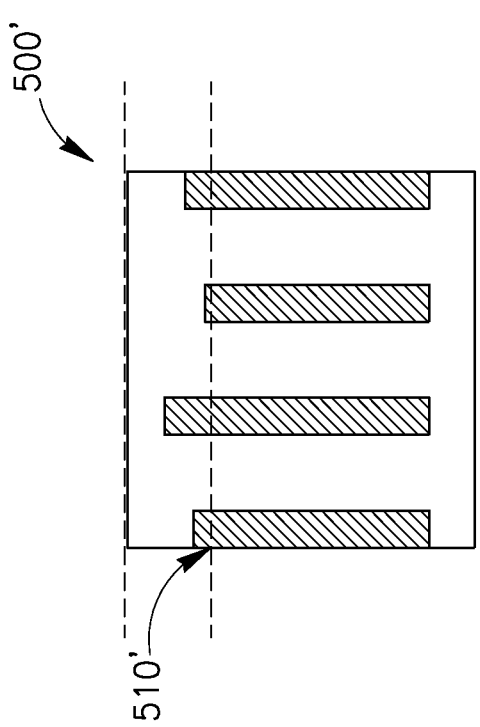

FIG. 4 illustrates an isometric view of a device comprising supported micro-mirrors. The device shown in this FIG. is illustrated in an upside down position. In order to fabricate the device, a DSoI wafer was used. Wafer layer (410) is used for the mirror surface, while the support structure discussed hereinbefore, is made of the second wafer layer (430). The layers are separated from each other by an oxide layer (420). FIGS. 5A-5B further illustrate another aspect of the difference obtained between a device comprising a support structure that has been etched of the support structure in accordance with the present invention (FIG. 5A), and that of prior art (FIG. 5B). Device 500 comprises in its upper part a first active layer 510, being the mirror layer, a second active layer 530 which is used for the support structure 535 and an oxide layer 520 located between the two active layers. Consequently, the support structure of the device of the present invention is not time based fabricated but is "stop etched" by the oxide itself. As opposed to device of the present invention, it may clearly be seen that layer 510', i.e. the mirror layer of device 500' which is fabricated by methods such as time stop methods referred to in the prior art, the considerably less accurate than the respective one of device 500.

In addition, the method provided allows achieving not only very accurate support structures but also allows decoupling the mirror surface thickness selection from the design of the support structure.

While the present invention has been particularly described, persons skilled in the art will appreciate that many variations and modifications can be made. Therefore, the invention is not to be construed as restricted to the embodiments described, e.g. to any particular shape of the support structure or the steps of the fabrication process, rather the scope, spirit and concept of the invention will be more readily understood by reference to the claims which follow. For example, it should be clear to any person skilled in the art that the fabrication process' steps may be carried out in a different order, e.g. preparing the two PECVD layers on both sides of the wafer prior to starting the etching step, preparing and/or stripping both photoresist layers at the same time, etc. It should be understood that any such shifting of the order in which the various steps are carried out is a matter of simple selection and can be done without departing from the scope of the invention.

The present invention has been described using non-limiting preferred embodiments thereof that are provided by way of example and are not intended to limit the scope of the invention. Variations of embodiments described will occur to persons of the art. Furthermore, the terms "comprise", "include", "have" and their conjugates, shall mean, when used in the claims, "including but not necessarily limited to." The scope of the invention is limited only by the following claims:

The invention claimed is:

1. A MEMS apparatus formed from a pre-fabricated multilayer semiconductor device at least one tilting micro-mirror wherein the at least one tilting micro-mirror comprises: a mirror layer formed by a first semiconductor layer of said prefabricated multi-layer semiconductor device and a support structure layer formed by a second semiconductor layer of said pre-fabricated multilayer device, wherein said mirror layer is coupled to said support structure layer by an insulating layer of said prefabricated multi-layer semiconductor device, wherein said support structure is patterned in a shape of a circular or ellipsoidal ring and a cross inside a perimeter of the circular or ellipsoidal ring, the cross having one or more ends extending beyond the perimeter of the circular or ellipsoidal ring and ribs intersecting inside the circular or ellipsoidal ring.

2. A MEMS apparatus according to claim 1, wherein the pre-fabricated multi-layer semiconductor device is a double active layer silicon-on-insulator (DSoI) substrate comprising the first semiconductor layer and the second semiconductor layer, wherein the mirror layer for the at least one tilting micro-mirror is formed in the first semiconductor layer of said DSoI substrate and wherein the support structure layer for the at least one tilting micro-mirror is formed in the second semiconductor layer of said DSoI substrate, and wherein said insulating layer separates the first semiconductor layer and the second semiconductor layer.

3. A MEMS apparatus according to claim 1, wherein the pre-fabricated multi-layer semiconductor device is a silicon-on-insulator (SoI) device comprising the first semiconductor layer and the second semiconductor layer, wherein the mirror layer for the at least one tilting micro-mirror is formed in the first semiconductor layer of said SoI device and wherein the support structure layer for the at least one tilting micro-mirror is formed in the second semiconductor layer of said SoI device, and wherein said insulator separates the first semiconductor layer and the second semiconductor layer.

4. A MEMS apparatus according to claim 1, wherein said support structure layer is formed by etching the full thickness of said second semiconductor layer at pre-defined locations thereof.

5. A MEMS apparatus according to claim 1, wherein said support structure layer formed in the shape of the circular or ellipsoidal ring defines an outer periphery of the tilting micro-mirror.

6. A MEMS apparatus formed from a pre-fabricated multilayer semiconductor substrate having an oxide layer positioned in between a first semiconductor layer and a second semiconductor layer, comprising:
a tilting micro-mirror formed from the pre-fabricated multilayer semiconductor substrate to include:
a mirror layer patterned in the first semiconductor layer and having a mirrored upper surface; and
a support structure vertically underlying the mirrored upper surface of the mirror layer and patterned in the second semiconductor layer, said support structure directly attached to an underside surface of said oxide layer and patterned in a shape of a circular or ellipsoidal ring and a cross inside a perimeter of the circular or ellipsoidal ring, the cross having one or more ends extending beyond the perimeter of the circular or ellipsoidal ring and ribs intersecting inside the circular or ellipsoidal ring.

7. A MEMS apparatus according to claim 6, further comprising at least one actuator formed in the first semiconductor layer.

8. A MEMS apparatus according to claim 6, further comprising one or more plasma enhanced chemical vapor deposition (PECVD) layers etched on at least one of the first semiconductor layer and the second semiconductor layer, wherein the at least one tilting micro-mirror is etched in accordance with the one or more PECVD layers.

9. A MEMS apparatus according to claim 8, further comprising a photoresist layer deposited on the one or more PECVD layers.

10. A MEMS apparatus according to claim 6, wherein the pre-fabricated multilayer semiconductor substrate comprises at least one of an silicon-on-insulator (SoI) wafer and a double active layer silicon-on-insulator (DSoI) wafer.

11. A tilting MEMS mirror, comprising:
a mirror layer formed of a first semiconductor material layer having a mirrored upper surface and having a lower surface;
an insulating layer having an upper surface attached to the lower surface of the mirror layer vertically below the mirrored upper surface and having a lower surface; and
a support layer formed of a second semiconductor material layer by etching a plurality of cavities in the second semiconductor layer vertically underneath the tilting micro-mirror, said plurality of cavities being etched to form a cross inside a circular or ellipsoidal ring perimeter of the support layer, the cross having one or more ends extending beyond the perimeter of the circular or ellipsoidal ring and ribs intersecting inside the circular or ellipsoidal ring.

12. The tilting MEMS mirror of claim 11, wherein the support layer further includes a lower surface, said lower surface of the support layer patterned to define a ring of second semiconductor material at a peripheral edge of the MEMS mirror.

13. The tilting MEMS mirror of claim 11, wherein the first and second semiconductor material layers are active material layers of a double active layer silicon-on-insulator (DSoI) substrate.

14. The tilting MEMS mirror of claim 11, wherein the first and second semiconductor material layers are active and substrate layers, respectively, of a silicon-on-insulator (SoI) substrate.

* * * * *